United States Patent
Wang et al.

(10) Patent No.: US 6,291,285 B1
(45) Date of Patent: Sep. 18, 2001

(54) METHOD FOR PROTECTING GATE OXIDE LAYER AND MONITORING DAMAGE

(75) Inventors: Mu-Chun Wang, Hsinchu Hsien; Shiang Huang-Lu, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/215,884

(22) Filed: Dec. 16, 1998

(51) Int. Cl.⁷ .................. H01L 21/8234; H01L 23/552
(52) U.S. Cl. ................ 438/237; 257/659; 257/660
(58) Field of Search .................... 438/237, 953; 257/660

(56) References Cited

U.S. PATENT DOCUMENTS 5,497,345 * 3/1996 Cappelletti .............. 365/185.28

\* cited by examiner

*Primary Examiner*—Charles Bowers
*Assistant Examiner*—Nema Berezny
(74) *Attorney, Agent, or Firm*—Charles C. H. Wu; Charles C. H. Wu & Associates

(57) ABSTRACT

A method for protecting the gate oxide layer of a MOS device. The method can also be used to monitor the intensity of radiation and charged particles falling on the gate oxide layer. The method includes the provision of a substrate having a gate structure thereon and an inter-layer dielectric layer over the gate structure, wherein the gate structure further includes a gate oxide layer and a gate electrode. Thereafter, a shielding layer is formed over the inter-layer dielectric layer, and then a protection diode is formed to link the shielding to the substrate.

9 Claims, 1 Drawing Sheet

METHOD FOR PROTECTING GATE OXIDE LAYER AND MONITORING DAMAGE

BACKGROUND OF THE INVENTION

1. Field of Invention

The present invention relates to a method for protecting the gate oxide layer of a MOS device. More particularly, the present invention relates to a method that utilizes a shielding layer to protect the gate oxide layer against processing damages.

2. Description of Related Art

In the manufacturing the gate of a MOS device, a thin gate oxide layer is first formed over a semiconductor substrate. Thereafter, a polysilicon layer that acts as a gate electrode is formed over the gate oxide layer. Next, a dielectric layer is formed over the gate electrode and the substrate to form multi-layered metallic interconnects. The dielectric layer serves as a layer of insulating material separating the metallic interconnects from the gate electrode. Since the dielectric layer lies between the gate electrode and the first metallic interconnect, the dielectric layer is also known as an inter-layer dielectric (ILD) layer.

In general, a high-density plasma (HDP) etching operation is normally used to form metallic interconnects in the ILD layer. The HDP etching technique is preferred because ultimately a trench having a better gap-filling capacity is formed. However, during a HDP etching operation, quality of the gate oxide layer in the MOS device may be affected. The two main reasons are:

1. Due to the attraction effect of the gate electrode of a gate structure, charged particles in the high-density plasma penetrates through the dielectric layer into the gate electrode. Moreover, a portion of the charged particles are energetic enough to enter the gate oxide layer. Any movement of charged particles inside the gate oxide layer destroys the compact internal structure. Hence, defects may form within the gate oxide layer.

2. When an HDP etching operation is carried out, strong ultraviolet or short wavelength radiation are generated due to the bombardment of the substrate by highly charged particles within the plasma. Ultraviolet or short-wavelength radiation has a very high penetrating power and is able to pass through the dielectric layer surrounding the gate oxide layer. Ultimately, a portion of the light is absorbed by the gate oxide layer. Since ultraviolet rays or short-wavelength radiation contains a lot of energy, the electric charges originally trapped within the gate oxide layer, at the interface between the gate oxide layer and the substrate and at the interface between the gate oxide layer and the gate electrode, can be activated to produce a large quantity of excited electron-hole pairs. These excited electron-hole pairs move about destroying the fine crystalline structure within the gate oxide layer.

In fabricating semiconductor devices in the deep submicron range, the quality of the gate oxide layer is very important. Since a gate oxide layer can have a thickness as small as 100 Å, any attraction of charged particles or irradiation by ultraviolet or short-wavelength radiation creates many defects within the gate oxide layer. Once the gate oxide layer contains defects, quality of the semiconductor device can be affected and its product yield can be lowered.

The conventional method of minimizing damages inflicted upon the gate oxide layer is to form a protective diode that links the gate oxide layer with the substrate. As soon as charged particles reach the gate oxide layer, these charged particles are led to the protective diode and then drained away via the substrate. Hence, the protective diode is able to reduce the flow of charges within the gate oxide layer, and prevent much of the damage due to the attraction effect. However, the protective diode is unable to protect the gate oxide layer against destructive ultraviolet rays or other short-wavelength radiation. Therefore, any short-wavelength radiation or ultraviolet light generated by high-density plasma can still penetrate into the gate oxide layer.

In light of the foregoing, there is a need to provide a method of minimizing the damages inflicted upon the gate oxide layer of a MOS device due to plasma etching.

SUMMARY OF THE INVENTION

Accordingly, the purpose of the present invention is to provide a method for protecting the gate oxide layer of a MOS device against damages caused by charged particles, ultraviolet rays or short wavelength radiation.

In another aspect, the purpose of the invention is to provide a method for monitoring the degree of damage to the gate oxide layer caused by plasma etching. Hence, proper settings of all the parameters needed to carry out a plasma etching operation so that a high-quality gate oxide layer can be obtained are available.

To achieve these and other advantages and in accordance with the purpose of the inventions as embodied and broadly described herein, the invention provides a method for protecting the gate oxide layer. The method includes the steps of providing a gate structure above a substrate, wherein the gate structure further comprises a gate oxide layer and a gate electrode. An inter-layer dielectric layer is formed over the substrate and the gate structure, and then a shielding layer is formed over the inter-layer dielectric layer. A protection diode is formed to link the shielding layer and the substrate.

The method of this invention is capable of preventing the damaging effect inflicted upon the gate oxide layer due to the attraction of charged particles by the gate electrode. In addition, the method is also capable of protecting the gate oxide layer against radiation damage by ultraviolet and other short wavelength radiation generated by high-density plasma. The shielding layer is able to block charge particles as well as any harmful ultraviolet or short-wavelength radiation. This is because charged particles or harmful radiation generates electric charges on entering the shielding layer. The electric charges are then channeled away from the shielding layer to the substrate via the protection diode. With all the energetic charged particles and harmful radiation screened by the shielding layer, quality of the gate oxide layer can be maintained.

Furthermore, by monitoring the quantity of electric charges flowing through the protection diode, data regarding the amount of ultraviolet light or short-wavelength radiation produced by the plasma can be obtained. Thus, parameters for operating a plasma etching station can be adjusted according to the data, and a gate oxide layer having the optimal quality can be produced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
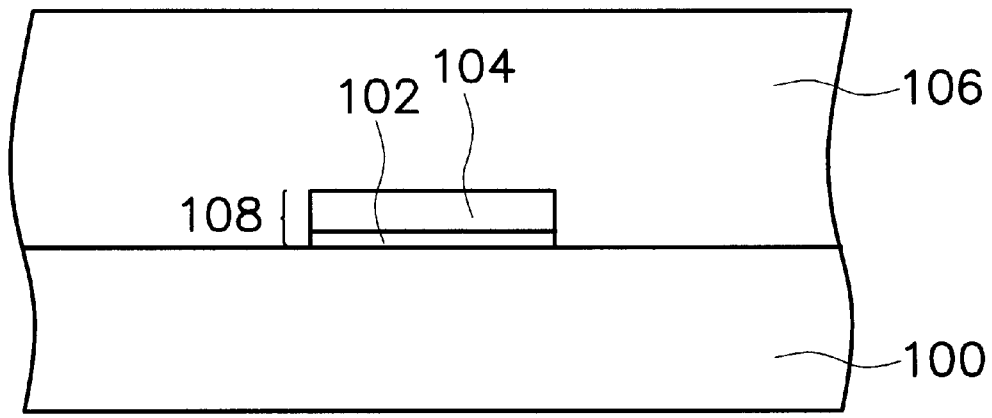
FIGS. 1A and 1B are schematic, cross-sectional views showing the progression of manufacturing steps in producing a gate structure having a gate-protecting mechanism according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
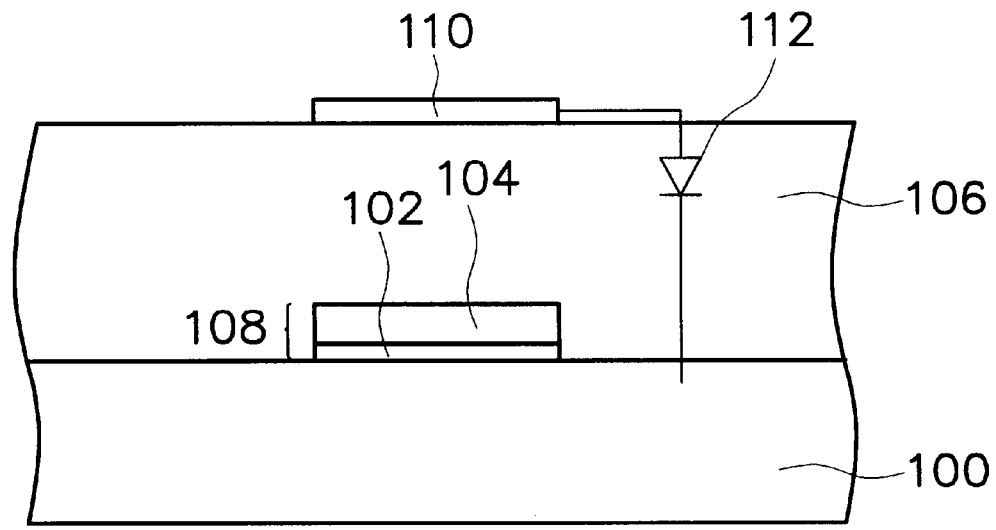

FIGS. 1A and 1B are cross-sectional views showing the progression of manufacturing steps in producing a gate structure having a gate-protecting mechanism according to one preferred embodiment of this invention.

As shown in FIG. 1A, a semiconductor substrate 100 having a gate structure 108 thereon is provided. The gate structure 108 includes a gate electrode 104 and a gate oxide layer 102. The gate electrode 104 can be a polysilicon layer. An inter-layer dielectric (ILD) layer 106 is formed over the substrate 100 and the gate structure 108. The ILD layer 106 can be an insulation layer, for example, a silicon dioxide layer.

As shown in FIG. 1B, a shielding layer 110 is formed over the ILD layer 106 by performing a chemical vapor deposition (CVD) operation. The shielding layer 110 can be a conductive layer including a metallic layer such as tungsten. A protection diode 112 is formed to link the shielding layer 110 to the substrate 100. When high-energy ultraviolet or short-wavelength radiation impinges upon the shielding layer 110, the radiation will be transformed into electric charges. Similarly, electric charges will also be produced inside the shielding layer 110 when charged particles enter the shielding layer 110 due to the attraction effect of the gate electrode. However, in the presence of the protection diode 112 that leads to the substrate 100, all the electric charges within the shielding layer 110 will be channeled away through the protection diode 112 to the substrate 100. Therefore, the gate oxide layer is screened from any harmful radiation or charged particles due to the attraction effect of the gate electrode. Hence, quality of the gate oxide layer is preserved.

In addition, the quantity of electric charges flowing through the protection diode 112 is related to the intensity of ultraviolet or short-wavelength radiation falling on the shielding layer 110. Therefore, by measuring the current flowing through the protection diode 112, the intensity of ultraviolet or short-wavelength radiation produced by a given set of input parameters to a plasma etching station can be monitored. An optimum set of plasma etching parameters for getting a best quality gate oxide layer 102 can be obtained.

The effectiveness of the method in protecting the gate oxide layer is best illustrated by comparing a silicon chip having a shielding layer connected to a protection diode with one without. When no shielding layer is formed above the gate oxide layer, the gate oxide layer is subjected to the radiation of ultraviolet or light of short wavelength. Hence, many electron-hole pairs are generated inside the gate oxide layer, thereby forming defects in its internal structure. In addition, charged particles are absorbed within the gate oxide due to the attraction effect. The quality of the gate oxide layer is poor. On the other hand, the shielding layer of this invention is able to screen out charged particles and harmful radiation by channeling away the resultant electric charges to the substrate via the protection diode. Consequently, quality of gate oxide layer is preserved.

In summary, the characteristic of this invention include the formation of a shielding layer over the inter-layer dielectric layer, and then forming a protection diode to link the shielding layer and the substrate. The shielding, layer is able to shield the gate oxide layer against any harmful ultraviolet or short-wavelength radiation. Hence. defects caused by damaging radiation are greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for protecting the gate oxide layer of a MOS device applicable to a substrate having a gate structure thereon and an inter-layer dielectric layer over the gate structure, wherein the gate structure includes a gate electrode and a gate oxide layer such that the gate oxide layer is located between the gate electrode and the substrate, comprising the steps of:

forming a metallic layer over the inter-layer dielectric layer; and forming a protection diode that connects the metallic layer to the substrate.

2. The method of claim 1, wherein the step of forming the shielding layer includes performing a chemical vapor deposition operation.

3. The method of claim 1, wherein the step of forming the shielding layer includes depositing tungsten to form a tungsten layer.

4. A method for protecting the gate oxide layer of a MOS device by screening out charged particles and harmful radiation, comprising the steps of:

providing a substrate having a gate structure thereon, wherein the gate structure includes a gate electrode and a gate oxide layer such that the gate oxide layer lies between the gate electrode and the substrate;

forming an inter-layer dielectric layer over the gate structure;

forming a metallic layer over the inter-layer dielectric layer; and forming a protection diode that connects from the metallic layer to the substrate.

5. The method of claim 4, wherein the step of forming the conductive layer includes performing a chemical vapor deposition operation.

6. The method of claim 4, wherein the step of forming the conductive layer includes depositing tungsten to form a tungsten layer.

7. A method for protecting the gate oxide layer of a MOS device by preventing the absorption of charged particles and harmful radiation, comprising the steps of:

providing a gate structure, wherein the gate structure includes a gate oxide layer and a gate electrode such that the gate electrode is located above the gate oxide layer;

forming a metallic layer over the gate structure, and forming a protection diode that connects from the metallic layer to the substrate.

8. The method of claim 7, wherein the step of forming the metallic layer includes performing a chemical vapor deposition operation.

9. The method of claim 7, wherein the step of forming the metallic layer includes depositing tungsten to form a tungsten layer.

* * * * *